(12) United States Patent
Auracher et al.

(10) Patent No.: US 6,781,727 B2
(45) Date of Patent: Aug. 24, 2004

(54) CONFIGURATION FOR OPERATING AN OPTICAL TRANSMISSION OR RECEPTION MODULE AT HIGH DATA RATES OF UP TO 10 GBIT/S

(75) Inventors: Franz Auracher, Baierbrunn (DE); Norbert Ebel, Berlin (DE); Alfred Ebberg, Heide (DE)

(73) Assignee: Infineon Technologies AG, Munich (DE)

( * ) Notice: Subject to any disclaimer, the term of this patent is extended or adjusted under 35 U.S.C. 154(b) by 408 days.

(21) Appl. No.: 09/740,648

(22) Filed: Dec. 18, 2000

(65) Prior Publication Data

US 2002/0085256 A1 Jul. 4, 2002

(51) Int. Cl.⁷ ............................ H04B 10/04; H04B 10/06
(52) U.S. Cl. .................. 359/163; 398/202; 398/164; 398/201; 398/212
(58) Field of Search ................. 361/736, 737, 361/760; 385/92, 93, 94; 398/164, 201, 212, 182, 202

(56) References Cited

U.S. PATENT DOCUMENTS

| | | | |
|---|---|---|---|
| 5,559,918 A | * | 9/1996 | Furuyama et al. ............ 385/92 |
| 5,802,228 A | * | 9/1998 | Bock et al. .................... 385/78 |
| 6,422,766 B1 | * | 7/2002 | Althaus et al. ............... 385/94 |
| 6,495,382 B2 | * | 12/2002 | Yap ............................... 438/24 |
| 6,632,029 B1 | * | 10/2003 | Williamson, III et al. .... 385/92 |

FOREIGN PATENT DOCUMENTS

| | | |
|---|---|---|
| DE | 197 18 950 A1 | 11/1998 |
| EP | 0 487 391 A1 | 5/1992 |
| EP | 0 568 851 A2 | 11/1993 |
| EP | 0 644 668 A1 | 3/1995 |
| EP | 0 664 585 A1 | 7/1995 |
| EP | 0 836 105 A1 | 4/1998 |
| EP | 0 890 858 A1 | 1/1999 |
| WO | WO 99/57594 | 11/1999 |

* cited by examiner

Primary Examiner—Hung N. Ngo
(74) Attorney, Agent, or Firm—Laurence A. Greenberg; Werner H. Stemer; Gregory L. Mayback

(57) ABSTRACT

The invention relates to an arrangement for operating an optical transmission or reception module at high data rates of up to 10 Gbit/s, having a TO package with electrical connections, an optical transmission or reception module arranged in the TO package, and a circuit board for making electrical contact with the electrical connections of the TO package. According to the invention, the circuit board (6) has RF lines (81, 82) and the electrical connections (41, 42) are connected to the RF lines (81, 82) in an arrangement parallel to the plane of the board. Preferably, provision is also made for an RF matching circuit to be produced on the board and for SMD components to be fitted directly and without further solder pads onto planar RF lines on the RF board. The cited measures serve to improve the RF properties of a TO module.

29 Claims, 5 Drawing Sheets

CONFIGURATION FOR OPERATING AN OPTICAL TRANSMISSION OR RECEPTION MODULE AT HIGH DATA RATES OF UP TO 10 GBIT/S

BACKGROUND OF THE INVENTION

1. Field of the Invention

The invention relates to a configuration for operating an optical transmission or reception module at high data rates of up to 10 Gbits/s.

It is known practice to use optical transmission or reception modules in so-called TO (transistor outline) packages at data rates of up to 622 Mbit/s. TO packages are standard packages, known in the prior art, for optical transmission or reception modules whose form is similar to the package of a (conventional) transistor but which have a glass window for the entry and exit of light on the top side. The name coaxial laser modules is given to modules which contain a TO laser module and in which a glass fiber is coupled to the TO laser module.

Such a TO package, for example known from WO 99/57594, is shown schematically in FIG. 3. The TO package 1 contains a transmission or reception module 2. The transmission module 2 is preferably arranged on a silicon substrate 3. The essential components of the transmission module 2, which is also called a laser submount, are a laser chip 21, deflection prisms 22, 23 on both sides of the laser chip 21, a coupling lens 24 and a monitor diode 25.

The TO package 1 has a baseplate 100 having four electrical bushings, only two of which are shown. The baseplate 100 has an upper side 101 and a bottom side 102. The RF signal (data signal) is routed into the interior of the package via an insulated, for example glazed, pin 42 and is electrically connected in the interior of the package to the laser chip 21 by means of bonding wires or strips. A further bushing pin 41 is used to supply the laser module with bias current or, if the bias current is supplied together with the RF signal via the pin 41, to connect it to ground. The pins (not shown) are used for controlling the monitor diode 25.

The window in the TO package 1 is used for coupling to an optical fiber which launches light from the laser chip 21 or, if the arrangement is of basically the same design in the form of a reception module, outputs light for detection by the reception chip.

The advantage of using TO packages is low package costs and established production facilities which permit large numbers to be produced at low production costs. However, when high data rates are used, the problem which arises is that TO packages have poor RF properties as a result of comparatively long bonding wires in the TO package, the bushing capacitance of the glazed package bushings and the generally undefined RF properties of the connection between the TO connection legs and a driving board.

On account of the poor RF properties when using TO packages, transmission or reception modules in so-called butterfly packages have been used to date for high data rates. However, such butterfly packages are much more expensive than TO packages.

SUMMARY OF THE INVENTION

The present invention is based on the object of providing an arrangement for operating an optical transmission or reception module which uses the economical TO design and can also be used at high data rates of up to 10 Gbit/s.

Accordingly, the invention provides for the arrangement to have a TO package having an optical transmission or reception module and also to have a circuit board for making electrical contact with the electrical connections of the TO package, the circuit board having RF lines and the electrical connections being directly connected to the RF lines in an arrangement parallel to the plane of the board. In this context, the RF lines are preferably in the form of planar lines having a defined characteristic impedance, in particular in the form of microstrip lines, to which the electrical connections are directly soldered in a parallel position.

Connecting the connection legs of the TO package directly to the RF lines in a parallel arrangement achieves good field matching between the RF line and the TO bushings, with the result that the RF properties of the arrangement are improved.

The use of RF lines having a defined characteristic impedance makes it possible to obtain an optimum match between the characteristic impedance of the RF lines and the impedance of the transmission or reception module. In this context, a match is produced, in particular, for the frequency-dependent impedance of the module's transmission or reception element and of its submount in the TO package, for the bonding connections to the connection pins of the transmission or reception module and for the characteristic impedance of the bushings for the electrical connections or pins of the TO package.

The RF lines on the board are preferably in the form of microstrip lines or coplanar lines. Other planar RF lines may also be used, however.

If the transmission module has a directly modulated laser, the characteristic impedance of the RF lines is preferably 30–50 ohms. If the transmission module has an electrical absorption modulator (EAM) which RF-modulates an inherently constant laser signal in line with a radiofrequency data signal, the characteristic impedance of the RF lines is preferably 50–80 ohms.

In a further aspect of the invention, provision is made for the RF circuit board to have a matching circuit for matching the impedance between the transmission or reception module and a driver or amplifier circuit arranged on the board. This ensures particularly effective and fault-free matching of the usually low-impedance semiconductor laser (typically 3 to 5 ohms) to the impedance of a driver circuit (usually 25 or 50 ohms), as a result of which the radiofrequency properties of the laser module are significantly improved.

If the reception module has a photodiode as reception chip, this photodiode usually has an associated preamplifier. In this case, the matching circuit ensures matching between the preamplifier and the RF line or data line situated on the RF board.

In this context, for the case in which the transmission module has a semiconductor laser and this semiconductor laser has signals from a driver circuit arranged on the RF board applied to it, provision is preferably made for the matching circuit to be designed for differential (symmetrical) driving of the transmission module by the driver circuit. A reception module may likewise be designed with differential (symmetrical) outputs on the preamplifier.

Alternatively, the matching circuit is designed for single-ended driving of the transmission module. However, the advantage of symmetrical driving over single-ended driving is that a higher signal swing is available for modulating the semiconductor laser, on account of the use of both driver outputs.

The matching circuit preferably has at least one resistor which matches the semiconductor laser to the impedance of the driver circuit.

In one preferred development of the invention, a bias circuit for generating a bias for the transmission or reception module is integrated onto the RF circuit board. In this case, the bias circuit preferably has a broadband RF inductor. This is used for RF blocking of the bias current connection of the semiconductor laser. By way of example, the inductor is a coil having a ferrite core.

The bias circuit and the matching circuit are preferably integrated into one circuit. In one preferred embodiment, this circuit has:

at least one first resistor, an RF inductor which is connected to a voltage source and applies a bias to the semiconductor laser via the first resistor, and a further resistor, whose one connection is connected to ground and whose other connection is connected to the first resistor.

In this context, a second resistor, connected in series with the first resistor, is preferably also provided, one connection of the further resistor being connected between the junction point of the two series-connected resistors.

Preferably, the inductor is additionally connected to ground via a relatively small capacitance. This ensures better blocking of the RF signal from the bias supply. In this case, the capacitance is arranged on the "cold side" of the inductor.

In one preferred aspect of the invention, if the lines of the matching circuit and/or bias circuit are in the form of planar RF lines and the components used in the circuit are produced using SMD (Surface Mounted Device) technology, that is to say can be fitted directly onto the printed circuit board, the planar RF paths are used as solder pads for the SMD components. This avoids the components being attached to the board by means of solder pads which are otherwise necessary. The solder pads or the area formed by them would change the characteristic impedance of the interconnects. In particular, the solder pads would form an excessive additional capacitance which would hinder realization of the desired bandwidth of 10 Gbit/s.

In this context, microstrip lines are preferably used as planar lines, and the microstrip lines are used as the solder surface for the SMD components.

In one preferred development of the invention, the RF circuit board is a two-layer board, one connection of the TO package being connected to RF lines on the top side of the board, and a second connection of the TO package being connected to a ground surface on the underside of the board. If the TO package has more than two electrical connections, for example when a monitor diode is additionally used, the circuit board is preferably a multilayer, in particular four-layer, board, with the connections of the pins for the monitor diode preferably being situated on the underside of the multilayer board and being decoupled from the RF lines by the ground plane.

The TO package is advantageously arranged directly at the edge of the board. Accordingly, contact is immediately made between the electrical connections of the TO package and the RF lines on the circuit board, and hence no significant reflection points arise for the RF signal.

To improve the RF properties of the TO package, provision is preferably made for the bonding wires in the TO package to be kept as short as possible in order to keep down the total inductance. To produce small inductances, parallel bonding connections or multiple bonds may be provided.

For the case in which the optical transmission or reception module is provided with a receiver chip, a further preferred measure to improve the RF properties of the TO module involves matching the impedance of the package bushing of the TO package to the value of the impedance at the output of the receiver chip.

Furthermore, provision is preferably made for a short piece of a stripline having a high characteristic impedance to be added at the output of the TO package. The effect achieved by this is that the frequency response of the TO package is raised.

DESCRIPTION OF THE PREFERRED EMBODIMENT

Figure 2A:
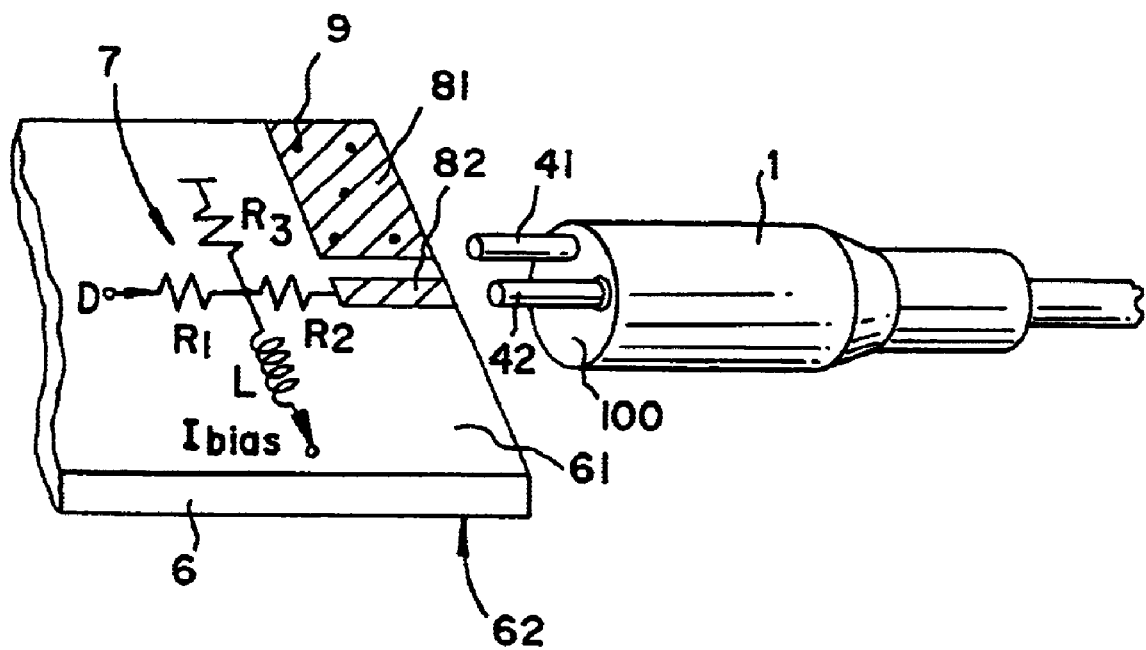
FIG. 2a shows an arrangement according to the invention with a circuit board, a matching circuit, produced on the circuit board, for a laser module with single-ended driving and a TO laser module.
Figure 2A:
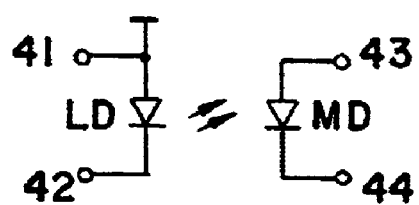
Figure 3:
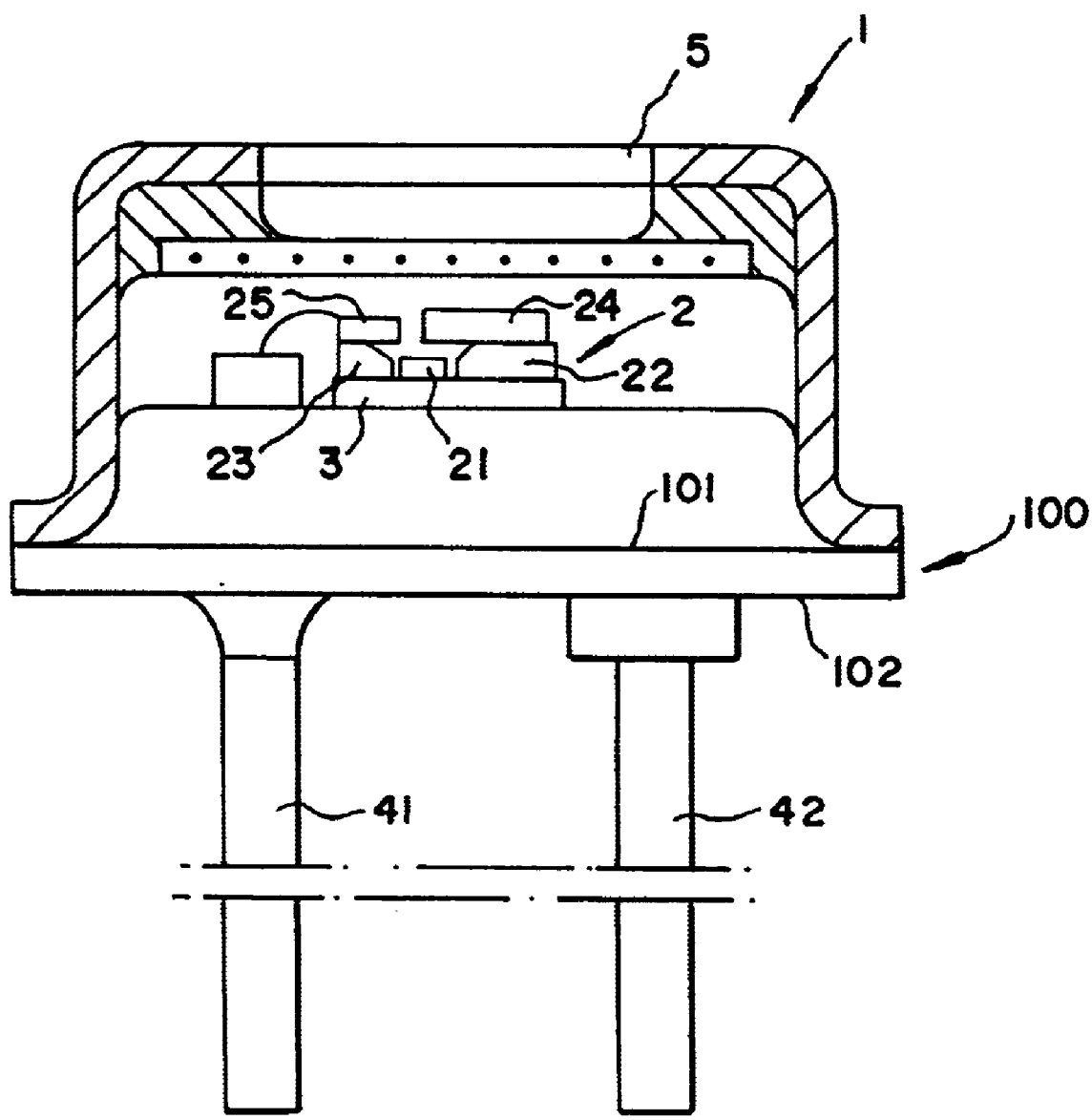
FIG. 3 shows a schematic illustration of a TO module in accordance with the prior art.

The invention is first explained using the illustrative embodiment shown in FIG. 2a. A transmission or reception module is arranged, as explained in the introduction with the aid of FIG. 3, in a TO package 1 in a manner known per se. The TO package 1 containing the transmission or reception module is also called TO module below. In addition, the transmission or reception module is called transmission module if it has a transmission device and is called reception module if it has a reception device.

As electrical supply lines, the TO package 1 has two legs or pins 41, 42 for driving the transmission or reception module. The pin 41 is connected to the bottom of the TO package (ground pin of the TO package), while the pin 42 is glazed in the bottom of the TO package and is therefore insulated from the package 1.

FIG. 2a shows only two supply lines. Usually, a transmission module additionally has a monitor diode for monitoring the transmission power. For such a case, further supply lines 43, 44 are provided, as shown schematically at the bottom of FIG. 2a.

The top side 61 of the RF board 6 has a matching circuit 7 for single-ended driving of the transmission module. This circuit will be explained in more detail later with the aid of FIG. 1a.

In addition, the surface 61 of the RF board 6 has a microstrip line 82 as contact pad for the pin 42 and a ground surface 81 as contact pad for the pin 41. The line 81 is electrically connected to a ground surface produced on the underside 62 of the board 2 via plated-through holes 9 (so-called bushing capacitors or vias) which are known per se.

The connections between the individual components of the matching circuit 7 and the supply lines therefor are likewise in the form of planar RF lines, in particular in the form of microstrip lines.

The TO package 1 is attached to the edge of the board such that the pins 41, 42 are soldered to the microstrip lines 81, 82 in a parallel, horizontal arrangement and, when attached, are arranged parallel to said microstrip lines. In this context, the gap between the TO package 1 and the edge of the board is kept as small as possible in order to prevent points of reflection arising for the RF signal.

The characteristic impedance of the RF lines on the RF board 6 is optimally matched to the frequency-dependent impedance of the transmission component and its submount in the TO package 1 and also to the glazed bushings of the pins 41, 42 through the package bottom. The characteristic impedance of the bushings is calculated using the inherently known formula for a coaxial line and is optimized by appropriately proportioning the pin diameter/hole diameter ratio.

For a TO transmission module 1 having a directly modulated laser, the microstrip line 82 preferably has a value of between 30 and 50 ohms. If the TO transmission module is operated with an electrical absorption modulator (EAM), the microstrip line 82 preferably has a value of from 50 ohms to 80 ohms.

When using a laser module which additionally has a monitor diode for regulating the optical power and, accordingly, further pins 43, 44, a four-layer multilayer board is preferably used instead of a single-layer board as in FIG. 2a, with the uppermost layer containing the interconnect for the RF lines and the second layer containing the ground surface for the RF lines. The connections of the pins 43, 44 for the monitor diode can then be situated on the underside of the multilayer board (bottommost layer), so that they are decoupled from the RF lines by the ground plane.

Figure 1B:
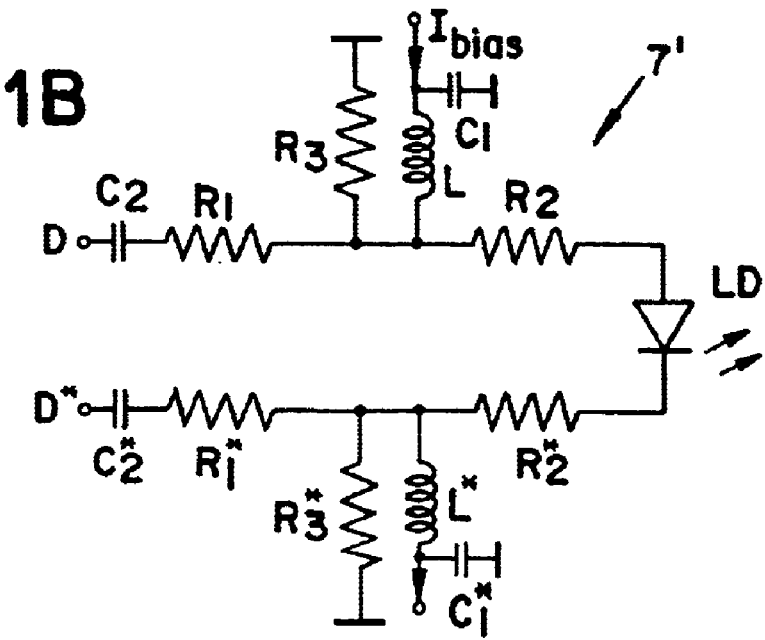
FIG. 1b shows a first illustrative embodiment of a matching circuit for a TO laser module with differential driving.
Figure 1C:
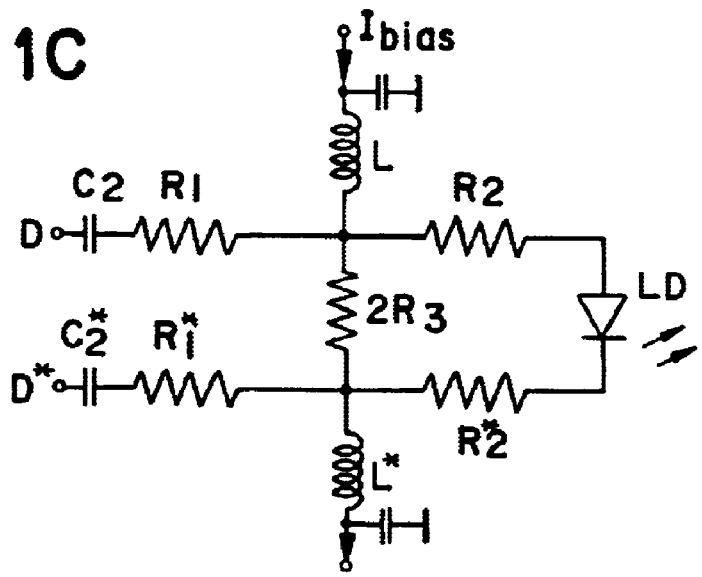
FIG. 1c shows a second illustrative embodiment of a matching circuit for a TO laser module with symmetrical driving.
Figure 1D:
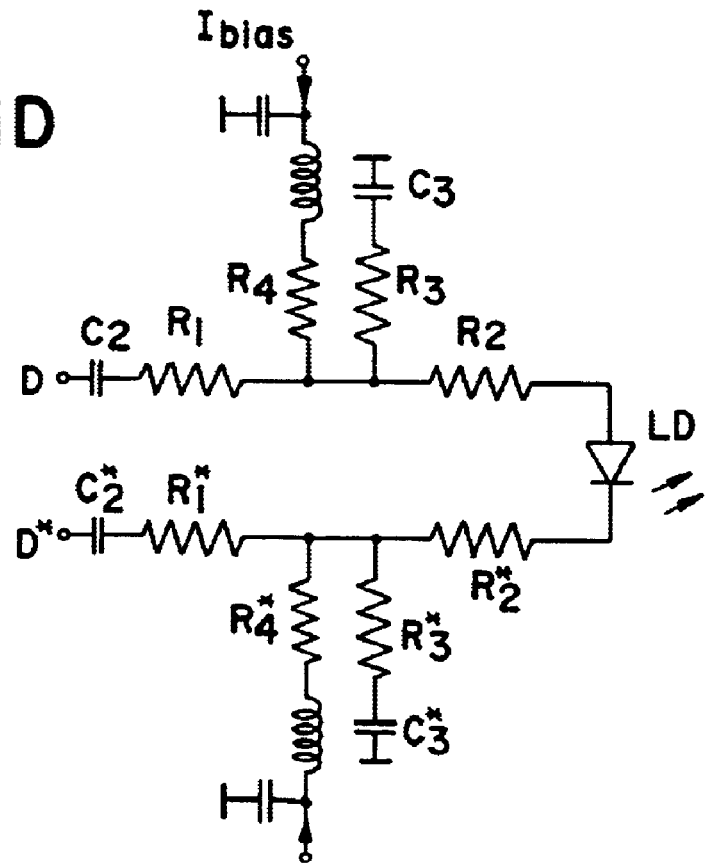
FIG. 1d shows a third illustrative embodiment of a matching circuit for a TO laser module with symmetrical driving.
Figure 2B:
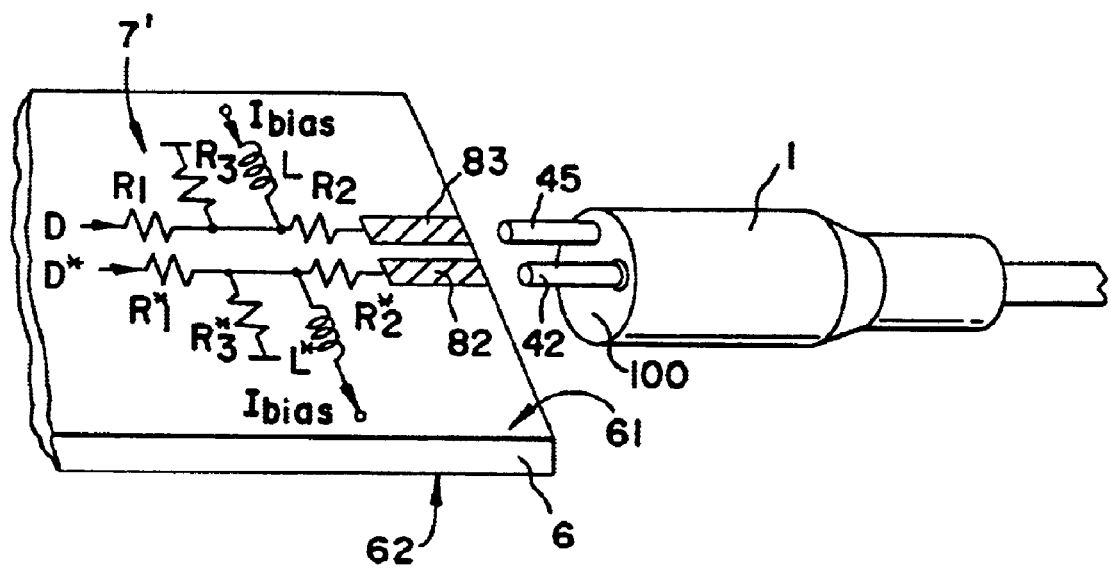
FIG. 2b an arrangement according to the invention with an RF circuit board, a drive circuit, produced on the circuit board, for a TO laser module with symmetrical driving and a TO laser module.
Figure 2B:
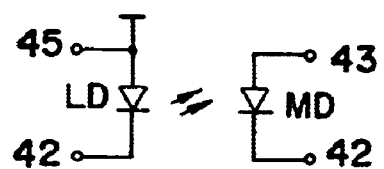

FIG. 2b shows, for essentially the same design, a matching circuit 7' for symmetrical driving of the TO module. The circuit is explained in more detail further below with the aid of FIGS. 1b to 1d.

Two legs/pins 42, 45 of the TO package 1 are directly soldered in a parallel arrangement onto two microstrip lines 82, 83, with the legs 42, 45 being electrically connected essentially over their entire length to the microstrip lines 82, 83. This greatly improves the radiofrequency properties of the coupling.

It should be pointed out that the matching circuit 7, 7' is shown only schematically in FIGS. 2a, 2b and also in FIGS. 1a–1d below. In each case, the circuit may be in the usual form for microwave circuits. In particular, the connections for the components are produced using matched lines, in particular using microstrip lines. Ground connections are produced by means of plated-through holes to the ground surface. The components used are RF compatible and are used in an appropriately matched physical size.

In this case, provision is made for the components of the circuits to be in the form of SMD (Surface Mounted Device) components and to be attached to the board surface 62 such that the microstrip lines themselves serve as solder pads. This means that the characteristic impedance of the interconnects on the board is not changed by otherwise necessary solder pads for the SMD assembly.

Figure 1A:
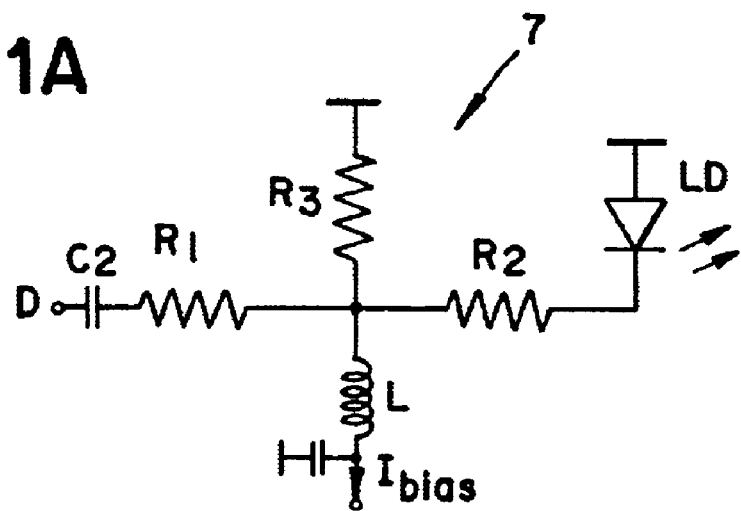
FIG. 1a shows an illustrative embodiment of a matching circuit, produced on an RF board, for a TO laser module with single-ended driving.

FIG. 1a shows a matching circuit 7 for a TO package having a laser diode. In the illustrative embodiment shown, the matching circuit has three resistors R1, R2, R3 and an RF inductor L. The resistors R1 and R2 are connected in series and are connected between a driver circuit (not shown), which produces a radiofrequency data signal D for controlling the laser diode, and a light emitting diode LD. In the illustrative embodiment shown, a blocking capacitor C2 which allows only radiofrequency signals to pass is situated between the driver circuit and the resistor R1.

The resistor R3 is connected transversely with respect to the resistors R1, R2, and one of its ends is connected to ground. At the same time, it is connected in parallel with an RF inductor L which is connected to a voltage source and outputs a bias current Ibias or a bias to the laser diode via the resistor R2. In this case, the RF inductor L is preferably provided with a ferrite core, in particular a tapered ferrite core or a winding with the pitch of the winding on the ferrite core varying in taper fashion. For the purpose of better decoupling of the RF signal from the bias supply, the "cold side" of the inductor, that is to say the side on which there is no RF signal present, is additionally connected to ground using a small capacitance C1 in an alternative embodiment, as law indicated in FIG. 1a.

In order to improve the RF properties, provision may also be made for the RF inductor L to be additionally connected in series with a resistor, in line with the resistor R4 in FIG. 1d.

The resistors R1, R2, R3 and the inductor L are preferably in the form of SMD components and are fitted directly onto microstrip interconnects which connect the components. The interconnects are thus themselves used as solder pads, making the use of additional solder pads on the board superfluous.

When a ceramic board is used as the board, provision is made for the resistors R1, R2, R4 to be integrated as sheet resistors.

FIG. 1b shows, for essentially the same design, a matching circuit 7' for a laser module with differential (symmetrical) driving. In the case of symmetrical driving, the laser diode LD has a data signal D, D* applied to it from both outputs of a driver. In this context, the data signal D* is inverted with respect to the data signal D.

The matching circuit 7' forms two circuit paths for the data signals D and D*, containing components R1, R2, R3, L and R1*, R2*, R3*, L*. In this case, the two circuit paths are each consistent with the circuit in FIG. 1a, so that reference is made to the comments in this regard. The resistances R1, R1* etc. and inductances L, L* are identical in each case.

The symmetrical driving used in FIG. 2b has considerable advantages over single-ended driving in accordance with FIG. 2a. Since both driver outputs are used, a relatively high signal swing is available for modulating the laser. This means that either the extinction of the modulated laser signal can be increased or the matching can be improved through appropriate choice of the resistors R1–R3.

A driver circuit generally has a highly frequency-dependent output impedance, which means that good matching to the load is difficult. The symmetrical driving partly compensates for this mismatch. In addition, the effective inductance of the bonding wires is reduced by comparison with single-ended driving. If, by way of example, the bonding inductances from pin 42 to the laser diode and from the laser diode to pin 41 were of equal magnitude in the two embodiments in FIGS. 2a, 2b, the bonding inductance effective for the driver output stage in the case of symmetrical driving would be half that for single-ended driving.

FIG. 1c shows a variant of the matching circuit with symmetrical driving of the laser module, in which the resistor R3 connects the two circuit arms for the data signal D and the data signal D* and has twice the resistance value.

In FIG. 1d, the resistor R3 is connected to ground not directly, but rather via a small capacitor C3, C3*, which has a value of 220 pF, for example. This reduces the DC requirement of the circuit.

Preferred values for R1, R2 and R3 in FIGS. 1a to 1d in the case of single-ended driving of the laser module and with matching to an output resistance of a driver of 50 ohms are:

R1=0 ohms–47 ohms
R2=8 ohms–20 ohms
R3=50 ohms–∞.

Preferred values for R1, R2 and R3 (or for R1*, R2*, R3*) in the case of symmetrical driving of the laser module and with matching to an output resistance of a driver of 50 ohms are:

R1=0 ohms–25 ohms
R2=4 ohms–10 ohms
R3=50 ohms–∞.

Low values of R1 and R2 and high values of R3 reduce the signal attenuation of the matching circuit. However, they generally produce poorer matching.

If a laser having an integrated electrical absorption modulator is used instead of a directly modulated laser chip, then preferred values for the matching resistors in the case of single-ended driving are as follows:

R1=10 ohms–30 ohms
R2=6 ohms–12 ohms
R3=50 ohms–400 ohms.

In the case of symmetrical driving, the following values are preferred:

R1=5 ohms–12 ohms
R2=3 ohms–6 ohms
R3=25 ohms–200 ohms.

The internal structure of the TO module in FIGS. 2a, 2b can be produced with a high level of reproducibility so that the RF properties of the transmission or reception module can be reproduced. In particular, the position and length of the bonding wires within the TO module need to be stipulated precisely. In this context, the bonding connections in the TO package need to be kept as short as possible in order to improve the RF properties. If appropriate, a plurality of bonds can be positioned in parallel (multiple bonds) or strips can be used for bonding. This keeps the total inductance as low as possible. In a transmission or reception module with a receiver chip, the necessary pads for bonding or multiple bonding need to be provided on said receiver chip.

If the TO package contains a reception module, the impedance of the TO package bushing also needs to be matched to the value of the output of the corresponding receiver component. The impedance thereof is usually 50 ohms.

In one variant of the invention which is not shown, a short piece of a stripline with a high characteristic impedance is added at the output of the TO package 1. As simulations have shown, this results in the frequency response of the TO package being raised at high frequencies.

In particular, combining the measures described above results in a flat frequency response for the TO package up to a frequency of approximately 7 to 10 GHz. Hence, such a design can also be used for data rates of 12.5 Gbit/s.

It should be pointed out that the features described above for improving the RF properties of the arrangement with the TO package and RF circuit board need not necessarily be produced at the same time. Each of these features may be produced independently and without the other features illustrated. In particular, the provision of an RF matching circuit, the connection of the pins of the TO package to planar RF conductors on the RF board in a horizontal plane and the attachment of components produced using SMD construction to planar RF lines on the RF board directly and without further solder pads represent aspects of the invention which can also be produced independently and not in combination with other measures.

What is claimed is:

1. A configuration for operating an optical transmission or reception module at high data rates of up to 10 Gbits/s, comprising:

a TO package with electrical connections and a baseplate, said baseplate having an upper side and a bottom side;

a module disposed in said package on said upper side of said baseplate, said module selected from the group consisting of an optical transmission module and an optical reception module; and an RF circuit board for making electrical contact with said electrical connections of said package;

said circuit board defining a plane and having RF lines;

said electrical connections of said package extending vertically below said bottom side of said baseplate and connected to said RF lines of said circuit board in a configuration parallel to said plane of said board.

2. The configuration according to claim 1, wherein:

said RF lines of said circuit board are in the form of planar lines having a defined characteristic impedance; and said electrical connections of said package are directly soldered to said RF lines of said circuit board in a parallel position.

3. The configuration according to claim 2, wherein said RF lines are microstrip lines.

4. A configuration for operating an optical transmission or reception module at high data rates of up to 10 Gbits/s, comprising:

a TO package with electrical connections;

a module configured in said package, said module selected from the group consisting of an optical transmission module and an optical reception module; and an RF circuit board for making electrical contact with said electrical connections of said package;

said circuit board defining a plane and having RF lines;

said electrical connections of said package connected to said RF lines of said circuit board in a configuration parallel to said plane of said board;

said RF lines of said circuit board being in the form of planar lines having a defined characteristic impedance;

said electrical connections of said package being directly soldered to said RF lines of said circuit board in a parallel position;

said module having an impedance; and said characteristic impedance of said RF lines being matched to said impedance of said module.

5. A configuration for operating an optical transmission or reception module at high data rates of up to 10 Gbits/s, comprising:

a TO package with electrical connections;

a module configured in said package, said module selected from the group consisting of an optical transmission module and an optical reception module; and an RF circuit board for making electrical contact with said electrical connections of said package;

said circuit board defining a plane and having RF lines;

said electrical connections of said package connected to said RF lines of said circuit board in a configuration parallel to said plane of said board;

said RF lines of said circuit board being in the form of planar lines having a defined characteristic impedance;

said electrical connections of said package being directly soldered to said RF lines of said circuit board in a parallel position;

said module having an impedance; and said characteristic impedance of said RF lines being matched to said impedance of said module.

6. A configuration for operating an optical transmission or reception module at high data rates of up to 10 Gbits/s, comprising:

a TO package with electrical connections;

a module configured in said package, said module selected from the group consisting of an optical transmission module and an optical reception module; and an RF circuit board for making electrical contact with said electrical connections of said package;

said circuit board defining a plane and having RF lines;

said electrical connections of said package connected to said RF lines of said circuit board in a configuration parallel to said plane of said board;

said RF lines of said circuit board being in the form of planar lines having a defined characteristic impedance;

said electrical connections of said package being directly soldered to said RF lines of said circuit board in a parallel position;

said module being said optical transmission module and including a directly modulated semiconductor laser; and said characteristic impedance of said RF lines being from 30 to 50 ohms.

7. A configuration for operating an optical transmission or reception module at high data rates of up to 10 Gbits/s, comprising:

a TO package with electrical connections;

a module configured in said package, said module selected from the group consisting of an optical transmission module and an optical reception module; and an RF circuit board for making electrical contact with said electrical connections of said package;

said circuit board defining a plane and having RF lines;

said electrical connections of said package connected to said RE lines of said circuit board in a configuration parallel to said plane of said board;

said RF lines of said circuit board being in the form of planar lines having a defined characteristic impedance;

said electrical connections of said package being directly soldered to said RF lines of said circuit board in a parallel position;

said module being said optical transmission module, and said characteristic impedance of said RF lines being from 50 to 80 ohms.

8. A configuration for operating an optical transmission or reception module at high data rates of up to 10 Gbits/s, comprising:

a TO package with electrical connections;

a module configured in said package, said module selected from the group consisting of an optical transmission module and an optical reception module;

an RF circuit board for making electrical contact with said electrical connections of said package;

said circuit board defining a plane and having RF lines;

said electrical connections of said package connected to said RF lines of said circuit board in a configuration parallel to said plane of said board;

said RF lines of said circuit board being in the form of planar lines having a defined characteristic impedance;

said electrical connections of said package being directly soldered to said RF lines of said circuit board in a parallel position;

an amplifier or driver circuit integrated into said circuit board; and a matching circuit for matching impedance between said module and said driver circuit.

9. The configuration according to claim 8, wherein:

said module is said optical transmission module and includes a semiconductor laser;

said driver circuit applies signals to said semiconductor laser; and said matching circuit is designed for symmetrical driving of said optical transmission module by said driver circuit.

10. The configuration according to claim 8, wherein:

said module is said optical transmission module and includes a semiconductor laser;

said driver circuit applies signals to said semiconductor laser; and said matching circuit is designed for single-ended driving of said optical transmission module by said driver circuit.

11. The configuration according to claim 10, wherein:

said driver circuit has an impedance; and said matching circuit includes at least one resistor that matches said semiconductor laser to said impedance of said driver circuit.

12. A configuration for operating an optical transmission or reception module at high data rates of up to 10 Gbits/s, comprising:

a TO package with electrical connections;

a module configured in said package, said module selected from the group consisting of an optical transmission module and an optical reception module;

an RF circuit board for making electrical contact with said electrical connections of said package;

said circuit board defining a plane and having RF lines;

said electrical connections of said package connected to said RF lines of said circuit board in a configuration parallel to said plane of said board;

said RF lines of said circuit board being in the form of planar lines having a defined characteristic impedance;

said electrical connections of said package being directly soldered to said RF lines of said circuit board in a parallel position; and a bias circuit for generating a bias for said module, said bias circuit integrated onto said circuit board.

13. The configuration according to claim 12, wherein said bias circuit includes a broadband RF inductor.

14. The configuration according to claim 12, wherein:

said bias circuit and said matching circuit are integrated into one circuit.

15. The configuration according to claim 14, wherein:

said module is said optical transmission module and includes a semiconductor laser;

said driver circuit applies signals to said semiconductor laser; and said matching circuit includes:
at least one first resistor;
an RF inductor for connection to a voltage source and for application of a bias to said semiconductor laser via said first resistor; and
a further resistor having a connection connected to ground and having another connection connected to said first resistor.

16. The configuration according to claim 15, comprising:
a relatively small capacitance connecting said inductor to ground.

17. The configuration according to claim 12, wherein:
a circuit selected from the group consisting of said matching circuit and said bias circuit includes planar RF lines;
said matching circuit includes SMD components produced using SMD technology; and
said planar RF lines define solder pads for said SMD components.

18. The configuration according to claim 17, wherein said planar RE lines are microstrip lines.

19. A configuration for operating an optical transmission or reception module at high data rates of up to 10 Gbits/s, comprising:
a TO package with electrical connections;
a module configured in said package, said module selected from the group consisting of an optical transmission module and an optical reception module;
an RF circuit board for making electrical contact with said electrical connections of said package;
said circuit board defining a plane and having RE lines;
said electrical connections of said package connected to said RE lines of said circuit board in a configuration parallel to said plane of said board;
said RF lines of said circuit board being in the form of planar lines having a defined characteristic impedance;
said electrical connections of said package being directly soldered to said RF lines of said circuit board in a parallel position;
an amplifier or driver circuit integrated into said circuit board;
a matching circuit for matching impedance between said module and said driver circuit; and
a bias circuit;
said bias circuit and said matching circuit being integrated into one circuit.

20. The configuration according to claim 19, wherein:
said module is said optical transmission module and includes a semiconductor laser;
said driver circuit applies signals to said semiconductor laser; and
said matching circuit includes:
at least one first resistor;
an RF inductor for connection to a voltage source and for application of a bias to said semiconductor laser via said first resistor; and
a further resistor having a connection connected to ground and having another connection connected to said first resistor.

21. The configuration according to claim 20, comprising:
a relatively small capacitance connecting said inductor to ground.

22. A configuration for operating an optical transmission or reception module at high data rates of up to 10 Gbits/s, comprising:
a TO package with electrical connections;
a module configured in said package, said module selected from the group consisting of an optical transmission module and an optical reception module;
an RF circuit board for making electrical contact with said electrical connections of said package;
said circuit board defining a plane and having RF lines;
said electrical connections of said package connected to said RF lines of said circuit board in a configuration parallel to said plane of said board;
said RF lines of said circuit board being in the form of planar lines having a defined characteristic impedance;
said electrical connections of said package being directly soldered to said RF lines of said circuit board in a parallel position;
a bias circuit for generating a bias for said module, said bias circuit integrated onto said circuit board; and
a circuit selected from the group consisting of said matching circuit and said bias circuit includes planar RF lines;
said matching circuit including SMD components produced using SMD technology; and
said planar RF lines defining solder pads for said SMD components.

23. The configuration according to claim 22, wherein said planar RF lines are microstrip lines.

24. A configuration for operating an optical transmission or reception module at high data rates of up to 10 Gbits/s, comprising:
a TO package with electrical connections;
a module configured in said package, said module selected from the group consisting of an optical transmission module and an optical reception module; and
an RF circuit board for making electrical contact with said electrical connections of said package;
said circuit board defining a plane and having RF lines;
said electrical connections of said package connected to said RF lines of said circuit board in a configuration parallel to said plane of said board;
said circuit board having two layers;
said circuit board including a topside having said RF lines and an underside having a ground surface;
said connections of said package including a first connection connected to said RF lines on said tap side of said circuit board and a second connection connected to said ground surface on said underside of said circuit board.

25. The configuration according to claim 1, wherein said circuit board is a multilayer board.

26. The configuration according to claim 1, wherein said circuit board has an edge, and said package is configured directly at said edge of said circuit board.

27. The configuration according to claim 1, wherein said package includes short bonding connections.

28. A configuration for operating an optical transmission or reception module at high data rates of up to 10 Gbits/s, comprising:
a TO package with electrical connections;
a module configured in said package, said module selected from the group consisting of an optical transmission module and an optical reception module; and an RF circuit board for making electrical contact with said electrical connections of said package;

said circuit board defining a plane and having RF lines;

said electrical connections of said package connected to said RF lines of said circuit board in a configuration parallel to said plane of said board;

said module being selected as said optical reception module and is a receiver chip having an output with an impedance;

said package has having a bushing with an impedance matched to said impedance of said output of said receiver chip.

29. A configuration for operating an optical transmission or reception module at high data rates of up to 10 Gbits/s, comprising:

a TO package with electrical connections;

a module configured in said package, said module selected from the group consisting of an optical transmission module and an optical reception module; and an RF circuit board for making electrical contact with said electrical connections of said package;

said circuit board defining a plane and having RF lines;

said electrical connections of said package connected to said RF lines of said circuit board in a configuration parallel to said plane of said board;

said package having an output with a short piece of a stripline having a high characteristic impedance.

* * * * *